(12) United States Patent
Campbell

(10) Patent No.: US 7,317,200 B2
(45) Date of Patent: *Jan. 8, 2008

(54) SNSE-BASED LIMITED REPROGRAMMABLE CELL

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/062,436

(22) Filed: Feb. 23, 2005

(65) Prior Publication Data

US 2006/0186394 A1   Aug. 24, 2006

(51) Int. Cl.
*H01L 47/00* (2006.01)

(52) U.S. Cl. .............................. 257/2; 257/5
(58) Field of Classification Search ................ 257/2–5
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |

(Continued)

FOREIGN PATENT DOCUMENTS

JP        5-6126916        10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.
Adler, D.; Moss, S.C., Amorphous Memories and Bistable Switches, J. Vac. Sci. Technol. 9 (1972) 1182-1189.
Adler, D.; Henisch, H.K.; Mott, S.N., The Mechanism of Threshold Switching in Amorphous Alloys, Rev. Mod. Phys. 50 (1978) 209-220.

(Continued)

*Primary Examiner*—Cuong Nguyen
(74) *Attorney, Agent, or Firm*—Dickstein Shapiro LLP

(57) ABSTRACT

Methods and apparatus for providing a memory device that can be programmed a limited number of times. According to exemplary embodiments, a memory device and its method of formation provide a first electrode, a second electrode and a layer of a chalcogenide or germanium comprising material between the first electrode and the second electrode. The memory device further includes a tin-chalcogenide layer between the chalcogenide or germanium comprising material layer and the second electrode.

69 Claims, 7 Drawing Sheets

U.S. PATENT DOCUMENTS

| | | |
|---|---|---|
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,363,329 A * | 11/1994 | Troyan ............ 257/2 |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |

| | | |
|---|---|---|
| 6,707,712 B2 | 3/2004 | Lowery |
| 6,714,954 B2 | 3/2004 | Ovshinsky et al. |
| 6,795,338 B2 * | 9/2004 | Parkinson et al. .......... 365/163 |
| 6,943,395 B2 * | 9/2005 | Oh et al. ........................ 257/2 |
| 6,967,344 B2 * | 11/2005 | Ovshinsky et al. ............ 257/2 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2004/0042265 A1 | 3/2004 | Moore et al. |
| 2004/0233748 A1 * | 11/2004 | Terao et al. ................. 365/202 |
| 2006/0035403 A1 | 2/2006 | Campbell |

FOREIGN PATENT DOCUMENTS

| | | |
|---|---|---|
| JP | 06053613 | 2/1994 |
| WO | WO 97/48032 | 12/1997 |
| WO | WO 99/28914 | 6/1999 |
| WO | WO 00/48196 | 8/2000 |
| WO | WO 02/21542 | 3/2002 |
| WO | WO 2006019845 | 2/2006 |

OTHER PUBLICATIONS

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43.(1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell* (PMC), pp. 1-6 (pre-May 2000).

Baranovskii, S.D.; Cordes, H., On the Conduction Mechanism Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., SIngle-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C.; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y.; Nishida, M., Ionic Condition in As2S3-Ag2S, GeS2-GeS-Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L. Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem. Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst, Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/ metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H.;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

Tugluoglu, N. et al.—Temperature-dependent barrier characteristics of Ag/P-SnSe Schottky diodes based on *I-V-T* measurements, Semiconductor Science and Technology, vol. 19, (2004) pp. 1092-1097.

* cited by examiner

SNSE-BASED LIMITED REPROGRAMMABLE CELL

FIELD OF THE INVENTION

The invention relates to the field of memory devices, and particularly to memory devices which can be programmed a limited number of times.

BACKGROUND

Resistance variable memory elements, which include Programmable Conductive Random Access Memory (PCRAM) elements, have been investigated for suitability as semi-volatile and non-volatile random access memory elements. An exemplary PCRAM device is disclosed in U.S. Pat. No. 6,348,365, which is assigned to Micron Technology, Inc.

A PCRAM device typically includes chalcogenide glass as the active switching material. A conductive material, such as silver, is incorporated into the chalcogenide glass creating a conducting channel. During operation of the device, the conducting channel can receive and expel metal ions (e.g., silver ions) to program a particular resistance state (e.g., a higher or a lower resistance state) for the memory element through subsequent programming voltages, such as write and erase voltages. After a programming voltage is removed, the programmed resistance states can remain intact for a period of time, generally ranging from hours to weeks. In this way, the typical chalcogenide glass-based PCRAM device functions as a variable resistance memory having at least two resistance states, which define two respective logic states.

One exemplary PCRAM device uses a germanium selenide (i.e., $Ge_xSe_{100-x}$) chalcogenide glass as a backbone along with silver (Ag) and silver selenide ($Ag_{2+/-x}Se$). See for example U.S. Patent Application Publication No. 2004/0038432, assigned to Micron Technology, Inc.

Although the silver-chalcogenide materials are suitable for assisting in the formation of a conductive channel through the chalcogenide glass layer for silver ions to move into, other non-silver-based chalcogenide materials may be desirable because of certain disadvantages associated with silver use. For example, use of silver-containing compounds/alloys such as $Ag_2Se$ may lead to agglomeration problems in the PCRAM device layering and Ag-chalcogenide-based devices cannot withstand higher processing temperatures, e.g., approaching 260° C. and higher. Tin (Sn) has a reduced thermal mobility in $Ge_xSe_{100-x}$ compared to silver and the tin-chalcogenides are less toxic than the silver-chalcogenides.

Research has been conducted into the use of thin films of SnSe (tin selenide) as switching devices under the application of a voltage potential across the film. It has been found that a 580 Å SnSe film shows non-volatile switching between a higher resistance state (measurable in MOhm) and a lower resistance state (measurable in kOhm) when potentials of 5-15 V are applied by forming an Sn-rich material (e.g., a dendrite). Also, the addition of Sn to a $Ge_xSe_{100-x}$ glass, which is a chalcogenide glass, has been found to produce memory switching if a high enough potential, e.g., >40 V, is applied across the chalcogenide glass. However, such switching potentials are too high for a viable memory device.

One time programmable (OTP) memory cells are known and have many applications. A typical OTP memory cell may function as a fuse or an antifuse. In a memory device application, such a fuse or antifuse may be connected between a column line and a row line. In a memory cell having a fuse, a charge sent through the column line will pass through the intact fuse in a cell to a grounded row line indicating a value of 1. To change the value of a cell to 0, a specific amount of current is applied to the cell to burn out the fuse. In a cell having an antifuse, the initial unprogrammed state a 0, and the cell is programmed to a 1 state. Once the conventional OTP cells are programmed, they cannot be erased or reprogrammed.

Accordingly, it is desired to have a resistance variable memory element which can act as an OTP or OTP-like memory cell. Additionally it is desirable to have such a memory element that can be reprogrammed at least once after an initial programming.

SUMMARY

Exemplary embodiments of the invention provide methods and apparatus for providing a memory device that can be programmed a limited number of times. According to exemplary embodiments, a memory device and its method of formation provide a first electrode, a second electrode and a layer of a chalcogenide or germanium comprising material between the first electrode and the second electrode. The memory device further includes a tin-chalcogenide layer between the chalcogenide or germanium comprising material layer and the second electrode.

The above and other features and advantages of the invention will be better understood from the following detailed description, which is provided in connection with the accompanying drawings.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The term "tin" is intended to include not only elemental tin, but tin with other trace metals or in various alloyed combinations with other metals as known in the semiconductor industry, as long as such tin alloy is conductive, and as long as the physical and electrical properties of the tin remain unchanged.

The term "tin-chalcogenide" is intended to include various alloys, compounds, and mixtures of tin and chalcogens (e.g., sulfur (S), selenium (Se), tellurium (Te), polonium (Po), and oxygen (O)), including some species which have a slight excess or deficit of tin. For example, tin selenide, a species of tin-chalcogenide, may be represented by the general formula $Sn_{1+/-x}Se$. Though not being limited by a particular stoichiometric ratio between Sn and Se, devices of the present invention typically comprise an $Sn_{1+/-x}Se$ species where x ranges between about 1 and about 0.

The term "chalcogenide material," "chalcogenide glass" or "crystalline chalcogenide" is intended to include materials, including glass or crystalline materials, that comprise an element from group VIA (or group 16) of the periodic table. Group VIA elements, also referred to as chalcogens, include sulfur (S), selenium (Se), tellurium (Te), polonium (Po), and oxygen (O). Examples of chalcogenide materials include GeTe, GeSe, GeS, InSe, and SbSe, all with various stoichiometries.

Figure 1:
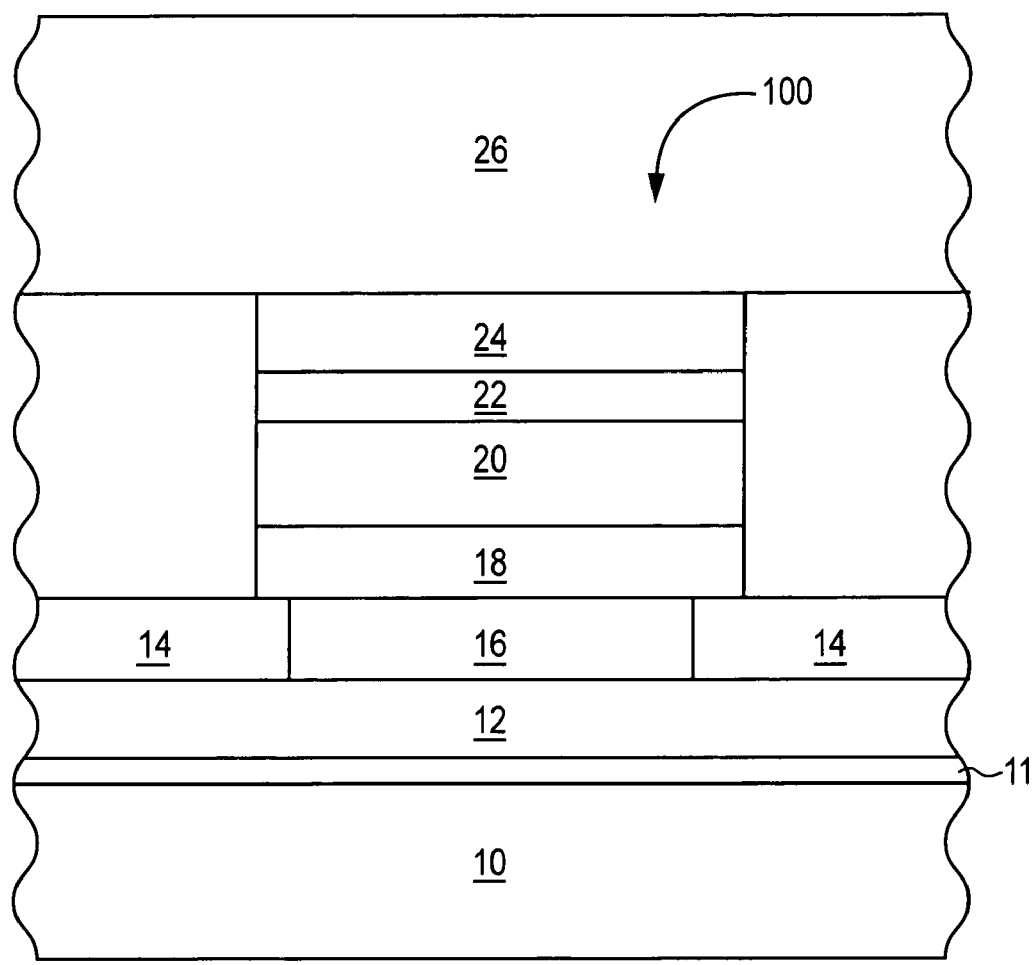
FIG. 1 illustrates a cross sectional view of a memory element according to an exemplary embodiment of the invention.

The invention is now explained with reference to the figures, which illustrate exemplary embodiments and throughout which like reference numbers indicate like features. FIG. 1 shows an exemplary embodiment of a memory element 100 constructed in accordance with the invention. The element 100 shown in FIG. 1 is supported by a substrate 10. Over the substrate 10, though not necessarily directly so, is a conductive address line 12, which serves as an interconnect for the element 100 shown and a plurality of other similar devices of a portion of a memory array of which the shown element 100 is a part. It is possible to incorporate an optional insulating layer 11 between the substrate 10 and address line 12, and this may be preferred if the substrate 10 is semiconductor-based. The conductive address line 12 can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials. Over the address line 12 is a first electrode 16, which is defined within an insulating layer 14, which is also over the address line 12. This electrode 16 can be any conductive material that will not migrate into the layer 18 described below, but is preferably tungsten (W). The insulating layer 14 can be, for example, silicon nitride ($Si_3N_4$), a low dielectric constant material, an insulating glass, or an insulating polymer, but is not limited to such materials. As shown in FIG. 1, an optional insulating layer 11 can be between the address line 12 and the substrate 10.

The memory element 100 (i.e., the portion which stores information) is formed over the first electrode 16. In the embodiment shown in FIG. 1, a chalcogenide material layer 18, for example, germanium selenide ($Ge_xSe_{100-x}$) is provided over the first electrode 16. The germanium selenide may be within a stoichiometric range of about $Ge_{33}Se_{67}$ to about $Ge_{60}Se_{40}$. The chalcogenide material layer 18 may be between about 100 Å and about 1000 Å thick, e.g., about 300 Å thick. Layer 18 need not be a single layer, but may also be comprised of multiple chalcogenide sub-layers having the same or different stoichiometries. The chalcogenide material layer 18 is in electrical contact with the underlying electrode 16. Alternatively, the memory element 100 can include a germanium comprising layer, which need not comprise a chalcogenide material, in place of the chalcogenide material layer 18.

Over the chalcogenide material layer 18 (or germanium comprising layer) is a layer of tin-chalcogenide 20, for example tin selenide ($Sn_{1+/-x}Se$, where x is between about 1 and 0). It is also possible that other chalcogenide materials may be substituted for selenium, such as sulfur, oxygen, or tellurium. The tin-chalcogenide layer 20 may be about 100 Å to about 400 Å thick; however, its thickness depends, in part, on the thickness of the underlying chalcogenide material layer 18. The ratio of the thickness of the tin-chalcogenide layer 20 to that of the underlying chalcogenide material layer 18 should be less than about 4:3, e.g., between about 1:3 and about 4:3. As the ratio of the thickness of the tin-chalcogenide layer 20 to that of the underlying chalcogenide material layer 18 decreases (i.e., the tin-chalcogenide layer 20 gets thinner as compared to the chalcogenide material layer 18), the memory element 100 may act more like an OTP cell.

Still referring to FIG. 1, an optional metal layer 22 is provided over the tin-chalcogenide layer 20, with silver (Ag) being the exemplary metal. This metal layer 22 is about 500 Å thick. Over the metal layer 22 is a second electrode 24. The second electrode 24 can be made of the same material as the first electrode 16, but is not required to be so. In the exemplary embodiment shown in FIG. 1, the second electrode 24 is preferably tungsten (W). The device(s) may be isolated by an insulating layer 26.

While the invention is not to be bound by any specific theory, it is believed that upon application of a conditioning voltage, metal ions from the tin-chalcogenide layer 20 form one or more conducting channels within the chalcogenide material layer 18. Specifically, the conditioning step comprises applying a potential across the memory element structure of the device 100 such that material from the tin-chalcogenide layer 20 is incorporated into the chalcogenide glass layer 18, thereby forming a conducting channel through the chalcogenide glass layer 18. Movement of ions from the layer 20 into or out of that conducting channel during subsequent programming forms a conductive pathway, which causes a detectible resistance change across the memory device 100.

Also, use of a tin-chalcogenide layer, such as layer 20 in this and other embodiments of the invention, offers improved temperature stability for the resulting device 100. For example, devices incorporating a tin-chalcogenide layer in accordance with the invention have been shown to function at temperatures of approximately 200° C. and can have a temperature tolerance in excess of approximately 300° C., which devices utilizing a chalcogenide glass and silver-containing layers cannot withstand.

In the exemplary embodiment of FIG. 1, the conditioning voltage alters the resistance state of the chalcogenide layer 18 from a high resistance state to a medium resistance state. A subsequently applied write voltage with a lower energy than that of the conditioning voltage can then program the chalcogenide layer to a lower resistance state. The application of the write voltage causes available metal ions to move into the conducting channels where they remain after the write voltage is removed forming conductive pathways.

A memory element according to exemplary embodiments of the invention (e.g., memory element 100) operates as an OTP or OTP-like memory element. That is, the memory element 100 can be programmed one time only and cannot be erased; or it can be programmed and erased a limited number of times (e.g., about 20 or fewer times).

As noted above, as the ratio of the thickness of the tin-chalcogenide layer 20 to that of the underlying chalcogenide material (or germanium) layer 18 decreases, the memory element 100 may act more like an OTP cell. It is believed that one reason this occurs is because metal, (e.g., silver) from metal layer 22 reacts with the tin from the tin-chalcogenide layer 20. The resultant alloy remains conductive, thereby promoting a low resistance state of the memory element 100.

FIGS. 2A-2D are cross sectional views of a wafer in various stages of fabrication depicting the formation of the memory element 100 according to an exemplary method embodiment of the invention. No particular order is required for any of the actions described herein, except for those logically requiring the results of prior actions. Accordingly, while the actions below are described as being performed in a general order, the order is exemplary only and can be altered if desired. Although the formation of a single memory element 100 is shown, it should be appreciated that the memory element 100 can be one memory element in an array of memory elements, which can be formed concurrently.

Figure 2A:
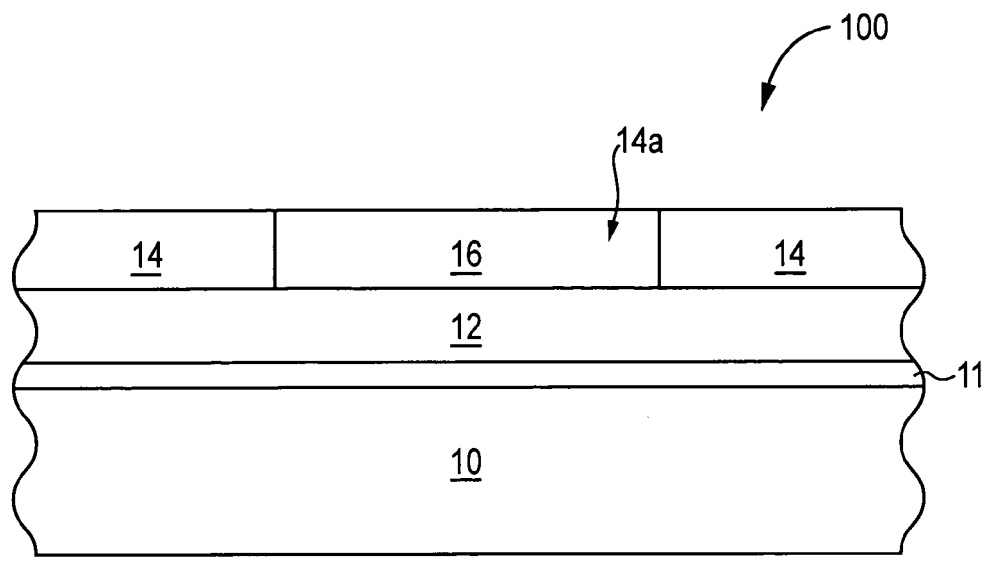
FIGS. 2A-2D illustrate cross-sectional views of the memory element of FIG. 1 at different stages of processing.

As shown by FIG. 2A, a substrate 10 is initially provided. As indicated above, the substrate 10 can be semiconductor-based or another material useful as a supporting structure. If desired, an optional insulating layer 11 may be formed over the substrate 10. The optional insulating layer 11 may be silicon oxide, silicon nitride, or other insulating materials. Over the substrate 10 (and optional insulating layer 11, if desired), the conductive address line 12 is formed by depositing a conductive material, such as doped polysilicon, aluminum, platinum, silver, gold, nickel, titanium, but preferably tungsten. The conductive material is patterned, for instance with photolithographic techniques, and etched to define the address line 12. The conductive material maybe deposited by any technique known in the art, such as sputtering, chemical vapor deposition, plasma enhanced chemical vapor deposition, evaporation, or plating.

An insulating layer 14 is formed over the address line 12. The insulating layer 14 can be silicon nitride, a low dielectric constant material, or other insulators known in the art, and may be formed by any known method. Preferably, the insulating layer 14 (e.g., silicon nitride) does not allow tin ion migration. An opening 14a in the insulating layer 14 is made, for instance by photolithographic and etching techniques, exposing a portion of the underlying address line 12. A first electrode 16 is formed within the opening 14a, by forming a layer of conductive material over the insulating layer 14 and in the opening 14a. A chemical mechanical polishing (CMP) step is performed to remove the conductive material from over the insulating layer 14. Desirably, the first electrode 16 is formed of tungsten, but any suitable conductive material that will not migrate into the layer 18 can be used.

Figure 2B:
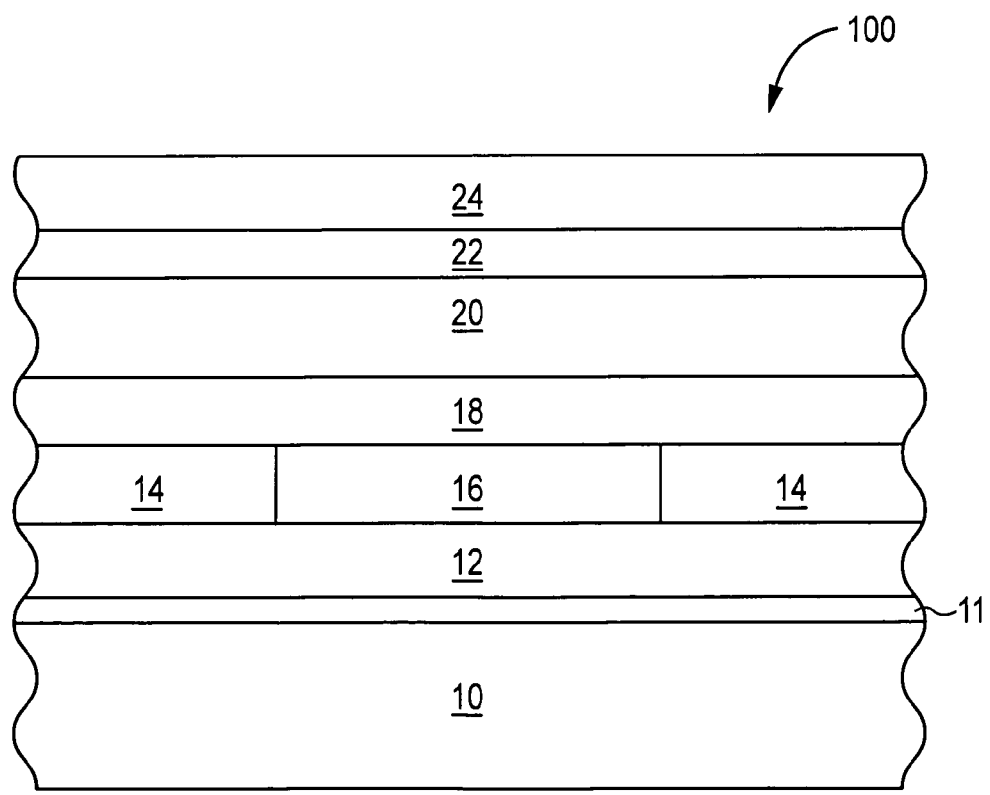

As shown in FIG. 2B, a chalcogenide material layer 18 is formed over the first electrode 16 and insulating layer 14. Formation of the chalcogenide material layer 18 may be accomplished by any suitable method, for example, by sputtering. The chalcogenide material layer 18 is formed, for example, to a thickness between about 100 Å and about 1000 Å, e.g., about 300 Å thick.

The memory element 100 can instead include a germanium comprising layer, which need not comprise a chalcogenide material, in place of chalcogenide material layer 18. In such a case, the germanium comprising layer may be formed by any known technique, for example, by sputtering.

A tin-chalcogenide layer 20 is formed over the chalcogenide material layer 18. The tin-chalcogenide layer 20 can be formed by any suitable method, e.g., physical vapor deposition, chemical vapor deposition, co-evaporation, sputtering, among other techniques. The tin-chalcogenide layer 20 is formed to a thickness of, for example, between about 100 Å to about 400 Å thick; however, its thickness depends, in part, on the thickness of the underlying chalcogenide material layer 18. The ratio of the thickness of the tin-chalcogenide layer 20 to that of the underlying chalcogenide material layer 18 is, desirably, less than about 4:3, e.g., between about 1:3 and about 4:3.

Optionally, a metal layer 22 is formed over the tin-chalcogenide layer 20. The metal layer 22 is preferably silver (Ag), or at least contains silver, and is formed to a preferred thickness of about 300 Å to about 500 Å. The metal layer 22 may be deposited by any technique known in the art.

A conductive material is deposited over the metal layer 22 to form a second electrode 24. Similar to the first electrode 16, the conductive material for the second electrode 24 may be any material suitable for a conductive electrode. In one exemplary embodiment the second electrode 24 is tungsten.

Figure 2C:
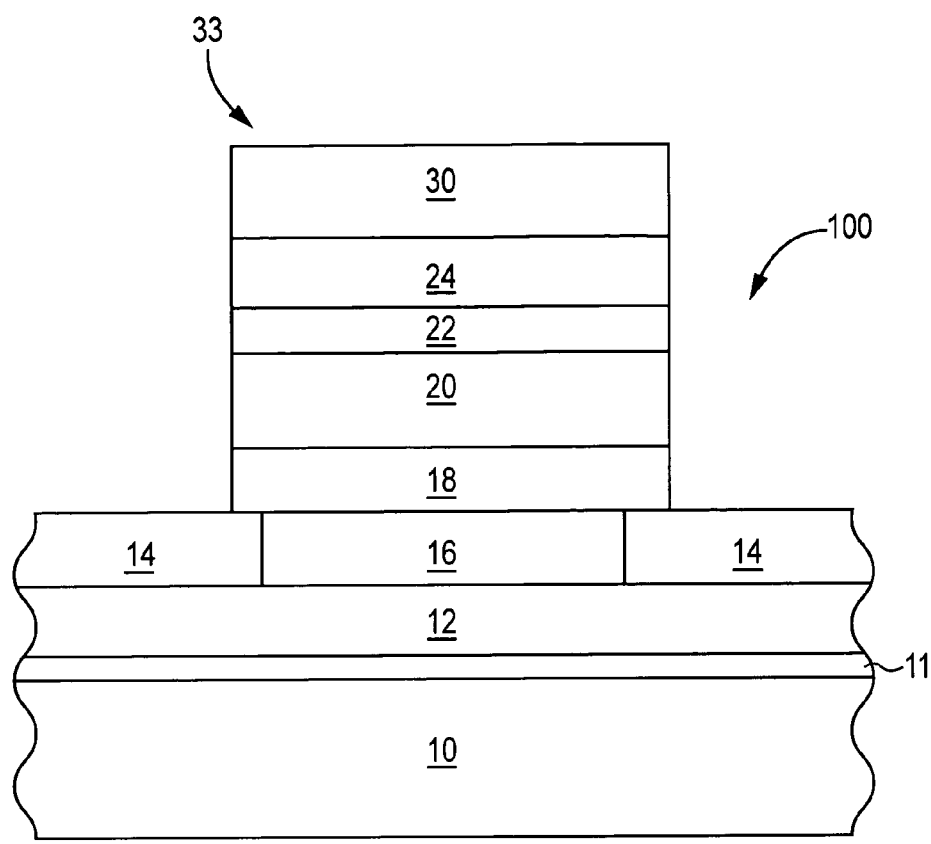
Figure 2D:
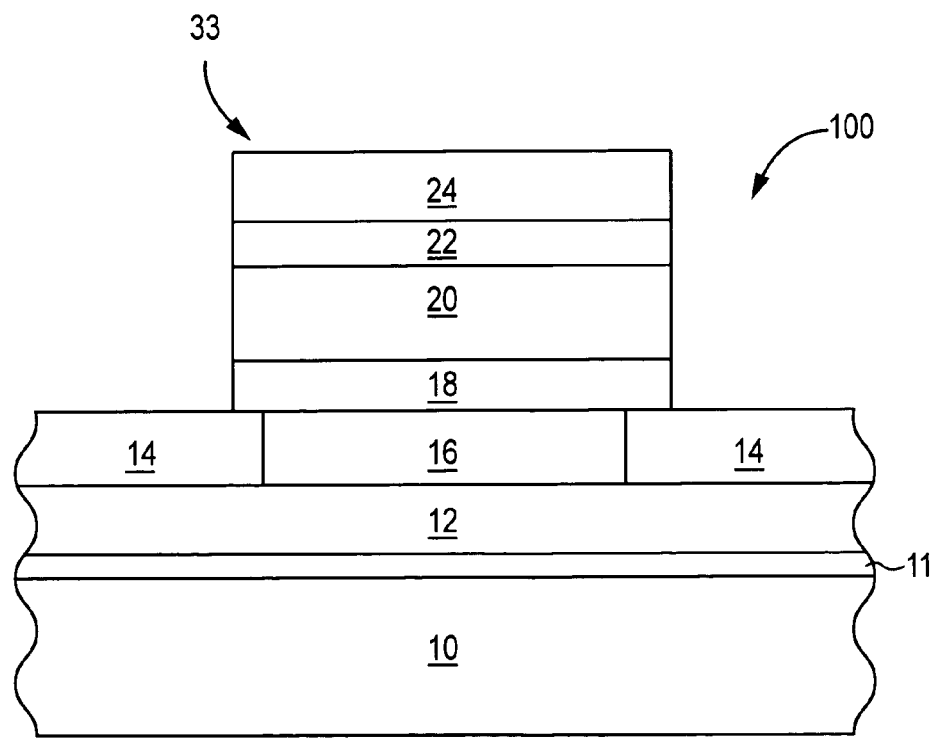

Referring to FIG. 2C, a layer of photoresist 30 is deposited over the second electrode 24 layer, masked and patterned to define a stack 33 of the memory element 100. An etching step is used to remove portions of the layers 18, 20, 22, 24, with the insulating layer 14 used as an etch stop, leaving stack 33 as shown in FIG. 2C. The photoresist 30 is removed, leaving the structure shown in FIG. 2D.

An insulating layer 26 is formed over the stack 33 and insulating layer 14 to achieve the structure shown in FIG. 1. This isolation step can be followed by the forming of connections from the defined memory cell electrodes 16, 24 to other circuitry of the integrated circuit (e.g., logic circuitry, sense amplifiers, etc.) of which the memory element 100 is a part.

Figure 3:
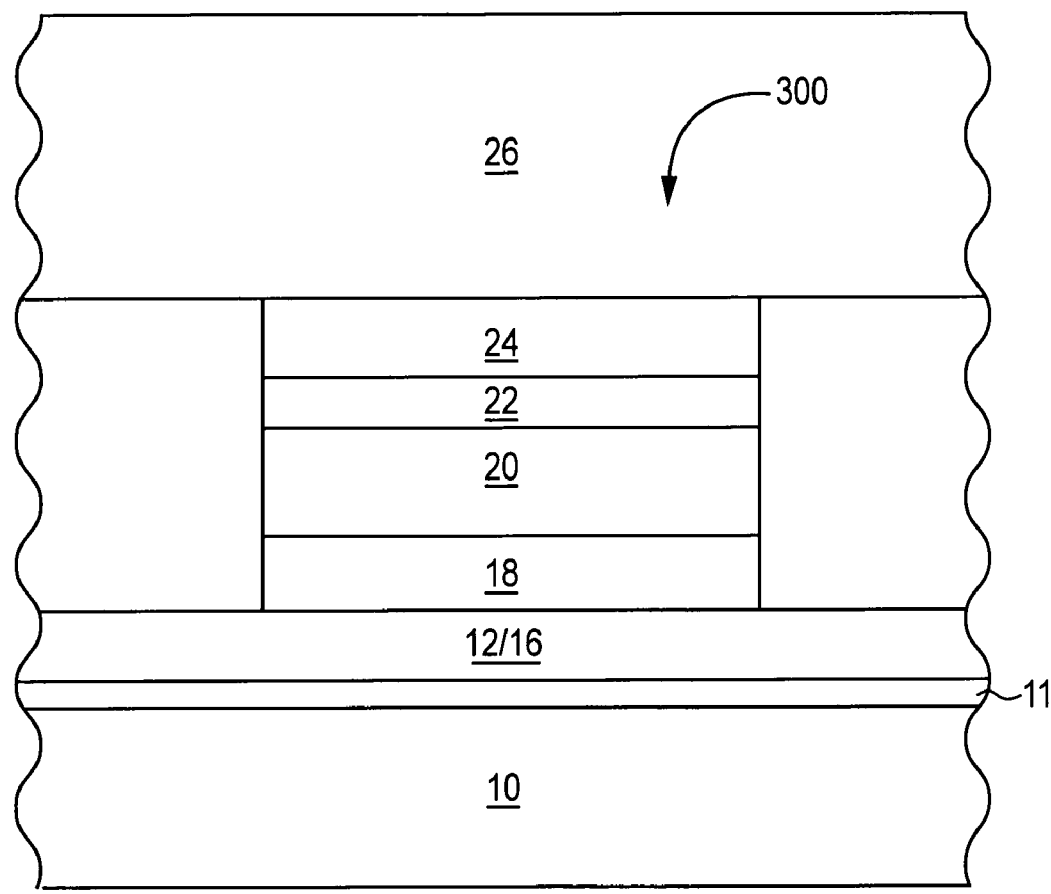
FIG. 3 illustrates a cross sectional view of a memory element according to another exemplary embodiment of the invention.

FIG. 3 shows a memory element 300 according to an exemplary embodiment of the invention. For the memory element 300, the address line 12 can also serve as the first electrode 16. In such a case, the formation of the separate first electrode 16 is omitted.

Figure 4:
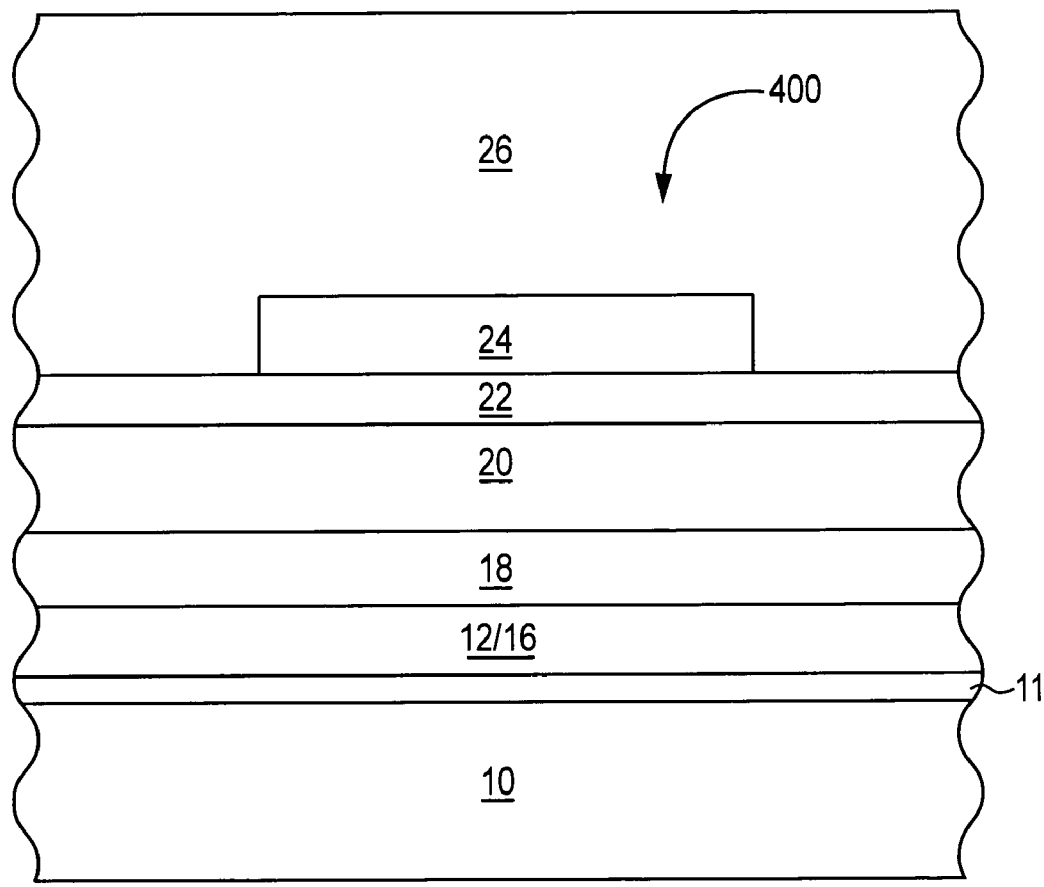
FIG. 4 illustrates a cross sectional view of a memory element according to another exemplary embodiment of the invention.

FIG. 4 illustrates a memory element 400 according to another exemplary embodiment of the invention. The memory element 400 is predominantly defined by the position of the second electrode 24. The layers 18, 20, 22 of the memory element 400 are blanket layers formed over a combined address line and electrode structure 12/16. Alternatively, a first electrode 16 that is separate from an underlying address line 12 can be used, as with memory element 100 (FIG. 1). In FIG. 4, the second electrode 24 is shown perpendicular to the plane of the page and the address line and electrode structure 12/16 is shown parallel to the plane of the page.

The location where the second electrode 24 is directly over the address line and electrode structure 12/16 defines the position of the conductive pathway formed during operation of the memory element 400. In this way, the second electrode 24 defines the location of the memory element 400.

Figure 5:
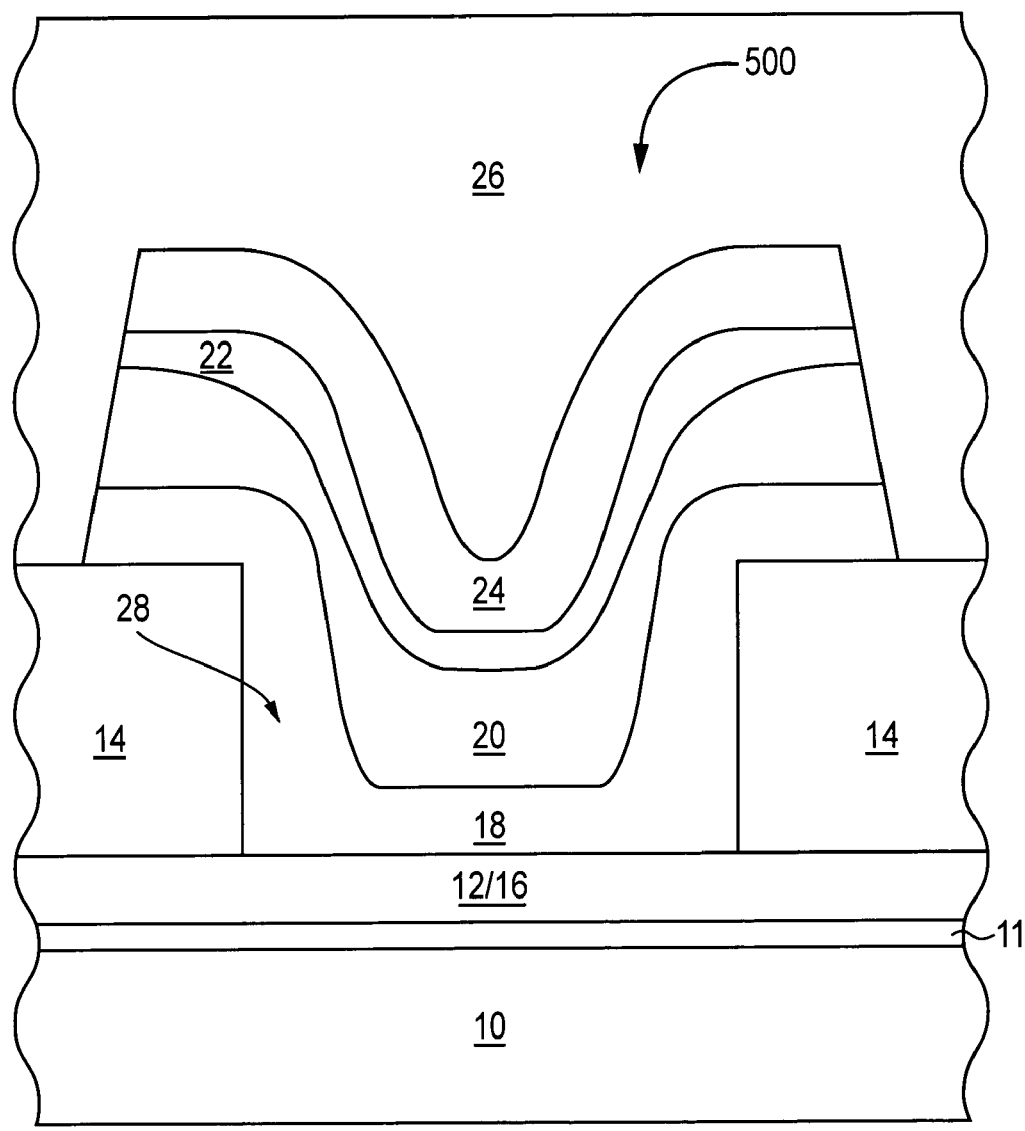
FIG. 5 illustrates a cross sectional view of a memory element according to another exemplary embodiment of the invention.

FIG. 5 represents a memory element 500 according to another exemplary embodiment of the invention. In the illustrated memory element 500, the chalcogenide material (or germanium), tin-chalcogenide, and optional metal layers 18, 20, 22 are formed in a via 28. The via 28 is formed in an insulating layer 14 over an address line and electrode structure 12/16. The layers 18, 20, as well as the second electrode 24, are conformally deposited over the insulating layer 14 and within the via 28. The layers 18, 20, 22, 24 are patterned to define a stack over the via 28, which is etched to form the completed memory element 500. Alternatively, a first electrode 16 that is separate from the underlying address line 12 can be used. Such a separate electrode 16 can be formed in the via 28 prior to the formation of the chalcogenide material (or germanium) layer 18.

The embodiments described above refer to the formation of only a few possible resistance variable memory element structures in accordance with the invention, which may be part of a memory array. It must be understood, however, that the invention contemplates the formation of other memory structures within the spirit of the invention, which can be fabricated as a memory array and operated with memory element access circuits.

Figure 6:
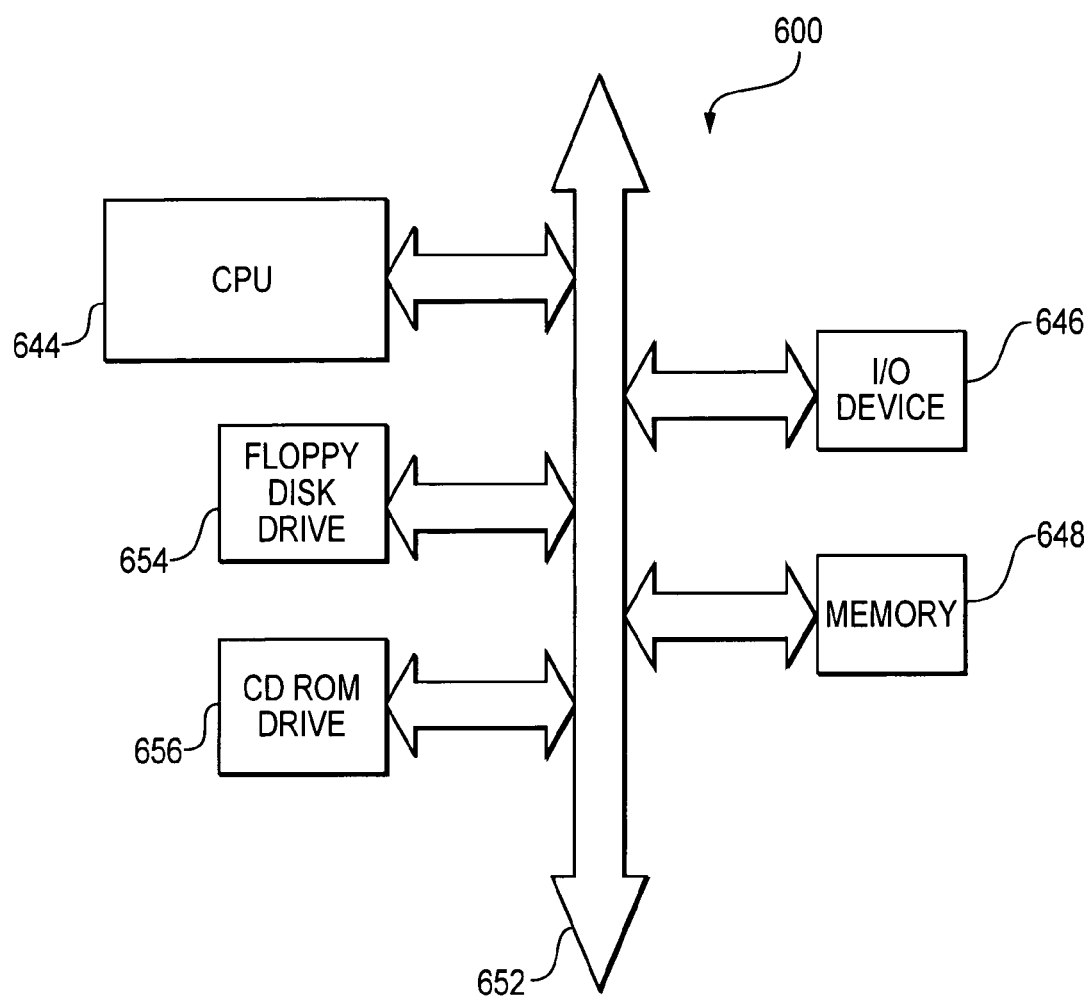
FIG. 6 illustrates a processor system according to an exemplary embodiment of the invention.

FIG. 6 illustrates a processor system 600 which includes a memory circuit 648, e.g., a memory device, which employs resistance variable memory elements (e.g., elements 100, 300, 400, and/or 500) according to the invention. The processor system 600, which can be, for example, a computer system, generally comprises a central processing unit (CPU) 644, such as a microprocessor, a digital signal processor, or other programmable digital logic devices, which communicates with an input/output (I/O) device 646 over a bus 652. The memory circuit 648 communicates with the CPU 644 over bus 652 typically through a memory controller.

In the case of a computer system, the processor system 600 may include peripheral devices such as a floppy disk drive 654 and a compact disc (CD) ROM drive 656, which also communicate with CPU 644 over the bus 652. Memory circuit 648 is preferably constructed as an integrated circuit, which includes one or more resistance variable memory elements, e.g., elements 100 (FIG. 1). If desired, the memory circuit 648 may be combined with the processor, for example CPU 644, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
   a first electrode;
   a second electrode;
   a material layer of a chalcogenide or semi-metal material between the first electrode and the second electrode; and
   a tin-chalcogenide layer between the material layer and the second electrode, a ratio of the thickness of the tin-chalcogenide layer to the thickness of the material layer being less than about 4:3.

2. The memory device of claim 1, wherein the material layer comprises a chalcogenide glass.

3. The memory device of claim 1, wherein the material layer comprises a crystalline chalcogenide material.

4. The memory device of claim 1, wherein the material layer is a layer of germanium.

5. The memory device of claim 1, wherein the material layer comprises germanium telluride.

6. The memory device of claim 1, wherein the material layer comprises $Ge_xSe_{100-x}$.

7. The memory device of claim 5, wherein the $Ge_xSe_{100-x}$ has a stoichiometry between about $Ge_{33}Se_{67}$ to about $Ge_{60}Se_{40}$.

8. The memory device of claim 1, further comprising a metal layer between the tin-chalcogenide layer and the second electrode.

9. The memory device of claim 1, wherein the metal layer comprises silver.

10. The memory device of claim 1, wherein said tin-chalcogenide layer comprises $Sn_{1+/-x}Se$, where x is between about 1 and about 0.

11. The memory device of claim 1, wherein the tin-chalcogenide layer comprises layer comprises tin-telluride.

12. The memory device of claim 1, wherein at least one of the first and second electrodes comprise tungsten.

13. The memory device of claim 1, wherein the second electrode is over the metal-containing layer and comprises silver.

14. The memory device of claim 1, wherein the material layer and the tin-chalcogenide layer are provided within a via in an insulating layer.

15. The memory device of claim 1, wherein the material layer and the tin-chalcogenide layer are blanket layers over a substrate, and wherein the second electrode defines the location of a memory element.

16. The memory device of claim 1, wherein a thickness of the material layer and a thickness of the tin-chalcogenide layer are such that the memory device is programmable a limited number of times.

17. The memory device of claim 1, wherein a thickness of the material layer and a thickness of the tin-chalcogenide layer are such that once the memory device is programmed, it cannot be erased.

18. The memory device of claim 1, wherein a thickness of the material layer is about 300 Å and a thickness of the tin-chalcogenide layer is between about 100 Å to about 400 Å.

19. The memory device of claim 18, further comprising a metal layer between the tin-chalcogenide layer and the second electrode, the metal layer having a thickness of about 300 Å to about 500 Å.

20. The memory device of claim 1, wherein a thickness of the material layer is between about 100 Å and about 1000 Å.

21. The memory device of claim 1, wherein the ratio of the thickness of the tin-chalcogenide layer to the thickness of the material layer is between about 1:3 and about 4:3.

22. A memory device, comprising:
   a substrate;
   a conductive address line over the substrate;
   a first electrode over the conductive address line;

a crystalline chalcogenide material layer over the first electrode;

a tin-chalcogenide layer over the crystalline chalcogenide material layer; and a second electrode over the tin-chalcogenide layer.

23. The memory device of claim 22, further comprising a metal layer between the tin-chalcogenide layer and the second electrode.

24. The memory device of claim 22, wherein a thickness of the crystalline chalcogenide material layer and a thickness of the tin-chalcogenide layer are such that the memory device is programmable a limited number of times.

25. The memory device of claim 22, wherein the ratio of the thickness of the tin-chalcogenide layer to the thickness of the crystalline chalcogenide material layer is less than about 4:3.

26. A memory device, comprising:
a substrate;
a conductive address line over the substrate;
a first electrode over the conductive address line;
a germanium layer over the first electrode;
a tin-chalcogenide layer over the germanium layer; and
a second electrode over the metal-containing layer.

27. The memory device of claim 26, further comprising a metal layer between the tin-chalcogenide layer and the second electrode.

28. The memory device of claim 26, wherein a thickness of the germanium layer and a thickness of the tin-chalcogenide layer are such that the memory device is programmable a limited number of times.

29. The memory device of claim 26, wherein the ratio of the thickness of the tin-chalcogenide layer to the thickness of the germanium layer is less than about 4:3.

30. A processor system, comprising:
a processor; and
a memory device configured to be programmable a limited number of times, the memory device comprising:
a first electrode;
a second electrode;
a material layer of a chalcogenide or semi-metal material between the first electrode and the second electrode; and
a tin-chalcogenide layer between the material layer and the second electrode, a ratio of the thickness of the tin-chalcogenide layer to the thickness of the material layer being less than about 4:3.

31. The processor system of claim 30, wherein the material layer comprises a chalcogenide glass.

32. The processor system of claim 30, wherein the material layer comprises a crystalline chalcogenide material.

33. The processor system of claim 30, wherein the material layer is a layer of germanium.

34. The processor system of claim 30, further comprising a metal layer between the tin-chalcogenide layer and the second electrode.

35. The processor system of claim 34, wherein the metal layer comprises silver.

36. A method of forming a memory device, the method comprising the acts of:
providing a substrate;
forming a first electrode over the substrate;
forming a second electrode over the substrate;
forming a material layer of a chalcogenide or semi-metal material, wherein the material layer is located between the first electrode and the second electrode; and
forming a tin-chalcogenide layer to be located between the material layer and the second electrode, the material layer and the tin-chalcogenide layer formed such that a ratio of the thickness of the tin-chalcogenide layer to the thickness of the material layer is less than about 4:3.

37. The method of claim 36, wherein forming the material layer comprises forming a layer comprising a chalcogenide glass.

38. The method of claim 36, wherein forming the material layer comprises forming a layer comprising a crystalline chalcogenide material.

39. The method of claim 36, wherein forming the material layer comprises forming a layer of germanium.

40. The method of claim 36, wherein forming the material layer comprises forming a layer comprising germanium telluride.

41. The method of claim 36, wherein forming the material layer comprises forming a layer comprising $Ge_xSe_{100-x}$.

42. The method of claim 41, wherein the $Ge_xSe_{100-x}$ is formed having a stoichiometry between about $Ge_{33}Se_{67}$ to about $Ge_{60}Se_{40}$.

43. The method of claim 36, further comprising forming a metal layer between the tin-chalcogenide layer and the second electrode.

44. The method of claim 36, wherein forming the metal layer comprises forming a silver comprising layer.

45. The method of claim 36, wherein forming the tin-chalcogenide layer comprises forming a layer of $Sn_{1+/-x}Se$, where x is between about 1 and about 0.

46. The method of claim 36, wherein forming the tin-chalcogenide layer comprises forming a layer comprising tin-telluride.

47. The method of claim 36, wherein at least one of the first and second electrodes are formed comprising tungsten.

48. The method of claim 36, wherein acts of forming the material layer and the tin-chalcogenide layer comprise forming the material layer and the tin-chalcogenide layer having thicknesses such that the memory device is programmable a limited number of times.

49. The method of claim 36, wherein acts of forming the material layer and the tin-chalcogenide layer comprise forming the material layer and the tin-chalcogenide layer having thicknesses such that once the memory device is programmed, it cannot be erased.

50. The method of claim 36, wherein the material layer is formed having a thickness of about 300 Å and the tin-chalcogenide layer is formed having a thickness between about 100 Å to about 400 Å.

51. The method of claim 50, further comprising forming a silver layer between the tin-chalcogenide layer and the second electrode, the silver layer formed having a thickness of about 300 Å to about 500 Å.

52. The method of claim 36, wherein the material layer is formed having a thickness between about 100 Å and about 1000 Å.

53. The method of claim 36, wherein the tin-chalcogenide layer and the material layer are formed such that the ratio of the thickness of the tin-chalcogenide layer to the thickness of the material layer is between about 1:3 and about 4:3.

54. The method of claim 36, further comprising providing an address line electrically connected with the first electrode.

55. The method of claim 36, wherein the act of forming the first electrode comprises forming a combined address line/electrode structure.

56. The method of claim 36, wherein the acts of forming the material layer and the tin-chalcogenide layer comprise blanket-depositing the forming the material layer and the tin-chalcogenide layer.

57. The method of claim 56, further comprising the act of etching forming the material layer and the tin-chalcogenide layer to form a vertical stack.

58. The method of claim 36, further comprising forming a via within an insulating layer, wherein the acts of forming the material layer and the tin-chalcogenide layer comprise forming the material layer and the tin-chalcogenide layer within the via.

59. A method of forming a memory element, the method comprising the acts of:
providing a substrate;
forming a conductive layer over the substrate;
forming a first electrode over the substrate;
forming a first insulating layer over the conductive layer and the substrate;
forming an opening in the first insulating layer to expose a portion of the conductive layer in the opening;
forming a material layer in the opening and over the first electrode, the material layer being a chalcogenide material or germanium;
forming a tin-chalcogenide layer in the opening and over the material layer, the material layer and the tin-chalcogenide layer formed such that a ratio of the thickness of the tin-chalcogenide layer to the thickness of the material layer is less than about 4:3;
forming a second electrode layer over the tin-chalcogenide layer;
providing a mask over the second electrode layer;
etching the material layer, the tin-chalcogenide layer, and the second electrode to form a stack.

60. The method of claim 59, wherein the act of forming the material layer comprises forming a chalcogenide glass layer.

61. The method of claim 59, wherein the act of forming the material layer comprises forming a crystalline chalcogenide material layer.

62. The method of claim 59, wherein the act of forming the material layer comprises forming a germanium layer.

63. The method of claim 59, wherein acts of forming the material layer and the tin-chalcogenide layer comprise forming the material layer and the tin-chalcogenide layer having thicknesses such that the memory device is programmable a limited number of times.

64. A method of forming a memory device, the method comprising the acts of:
providing a substrate;
forming a first electrode over the substrate;
forming a second electrode over the substrate;
forming a crystalline chalcogenide material layer, wherein the crystalline chalcogenide material layer is located between the first electrode and the second electrode;
forming a tin-chalcogenide layer, wherein the tin-chalcogenide layer is located between the chalcogenide material layer and the second electrode; and
forming a silver layer, wherein the silver layer is located between the tin-chalcogenide layer and the second electrode.

65. The method of claim 64, wherein the crystalline chalcogenide material layer and the tin-chalcogenide layer are formed having thicknesses such that the memory device is programmable a limited number of times.

66. The method of claim 64, wherein the tin-chalcogenide layer and the crystalline chalcogenide material layer are formed such that the ratio of the thickness of the tin-chalcogenide layer to the thickness of the crystalline chalcogenide material layer is less than about 4:3.

67. A method of forming a memory device, the method comprising the acts of:
providing a substrate;
forming a first electrode over the substrate;
forming a second electrode over the substrate;
forming a germanium layer, wherein the germanium layer is located between the first electrode and the second electrode;
forming a tin-chalcogenide layer, wherein the tin-chalcogenide layer is located between the chalcogenide material layer and the second electrode; and
forming a silver layer, wherein the silver layer is located between the tin-chalcogenide layer and the second electrode.

68. The method of claim 67, wherein the germanium layer and the tin-chalcogenide layer are formed having thicknesses such that the memory device is programmable a limited number of times.

69. The method of claim 67, wherein the tin-chalcogenide layer and the germanium layer are formed such that the ratio of the thickness of the tin-chalcogenide layer to the thickness of the germanium layer is less than about 4:3.

* * * * *

UNITED STATES PATENT AND TRADEMARK OFFICE
CERTIFICATE OF CORRECTION

PATENT NO. : 7,317,200 B2
APPLICATION NO. : 11/062436
DATED : January 8, 2008
INVENTOR(S) : Campbell It is certified that error appears in the above-identified patent and that said Letters Patent is hereby corrected as shown below:

In column 8, line 17, in Claim 6, delete "GexSe100-x" and insert -- $Ge_xSe_{100-x}$ --, therefor.

In column 8, line 19, in Claim 7, delete "GexSe100-x" and insert -- $Ge_xSe_{100-x}$ --, therefor.

In column 8, line 19, in Claim 7, delete "Ge33Se67" and insert -- $Ge_{33}Se_{67}$ --, therefor.

In column 8, line 20, in Claim 7, delete "Ge60Se40" and insert -- $Ge_{60}Se_{40}$ --, therefor.

In column 8, line 27, in Claim 10, delete "Sn1+/-xSe" and insert -- $Sn_{1+/-x}Se$ --, therefor.

In column 8, line 30, in Claim 11, after "layer comprises" delete "layer comprises".

In column 10, line 16, in Claim 41, delete "GexSe100-x" and insert -- $Ge_xSe_{100-x}$ --, therefor.

In column 10, line 17, in Claim 42, delete "GexSe100-x" and insert -- $Ge_xSe_{100-x}$ --, therefor.

In column 10, line 18, in Claim 42, delete "Ge33Se67" and insert -- $Ge_{33}Se_{67}$ --, therefor.

In column 10, line 19, in Claim 42, delete "Ge60Se40" and insert -- $Ge_{60}Se_{40}$ --, therefor.

UNITED STATES PATENT AND TRADEMARK OFFICE
CERTIFICATE OF CORRECTION

PATENT NO. : 7,317,200 B2
APPLICATION NO. : 11/062436
DATED : January 8, 2008
INVENTOR(S) : Campbell It is certified that error appears in the above-identified patent and that said Letters Patent is hereby corrected as shown below:

In column 10, line 26, in Claim 45, delete "Sn1+/-xSe" and insert -- $Sn_{1+/-x}Se$ --, therefor.

Signed and Sealed this

Twentieth Day of May, 2008

JON W. DUDAS
*Director of the United States Patent and Trademark Office*